United States Patent
Mohn (10) Patent No.: US 10,950,516 B2
(45) Date of Patent: Mar. 16, 2021

(54) RESIN ENCAPSULATED POWER SEMICONDUCTOR MODULE WITH EXPOSED TERMINAL AREAS

(71) Applicants: ABB Schweiz AG, Baden (CH); Audi AG, Ingolstadt (DE)

(72) Inventor: Fabian Mohn, Ennetbaden (CH)

(73) Assignees: ABB Schweiz AG, Baden (CH); AUDI AG, Ingolstadt (DE)

( * ) Notice: Subject to any disclaimer, the term of this patent is extended or adjusted under 35 U.S.C. 154(b) by 2 days.

(21) Appl. No.: 16/673,201

(22) Filed: Nov. 4, 2019

(65) Prior Publication Data
US 2020/0066609 A1    Feb. 27, 2020

Related U.S. Application Data

(63) Continuation of application No. PCT/EP2018/061017, filed on Apr. 30, 2018.

(30) Foreign Application Priority Data

May 2, 2017    (EP) .................................... 17169008

(51) Int. Cl.
| | |
|---|---|
| *H01L 23/31* | (2006.01) |
| *H01L 21/48* | (2006.01) |
| *H01L 21/56* | (2006.01) |
| *H01L 23/367* | (2006.01) |
| *H01L 23/498* | (2006.01) |
| *H01L 25/16* | (2006.01) |
| *H01L 23/00* | (2006.01) |

(52) U.S. Cl.
CPC ...... *H01L 23/3121* (2013.01); *H01L 21/4853* (2013.01); *H01L 21/565* (2013.01);
(Continued)

(58) Field of Classification Search
CPC combination set(s) only.
See application file for complete search history.

(56) References Cited

U.S. PATENT DOCUMENTS 10,236,806 B2    3/2019  Holzer et al.
2011/0260315 A1* 10/2011  Yamaguchi ........... H01L 25/072
                                                                257/696
(Continued)

FOREIGN PATENT DOCUMENTS

CN    102354688 A    2/2012
CN    203394862 U    1/2014
(Continued)

OTHER PUBLICATIONS

European Patent Office, International Search Report & Written Opinion issued in corresponding Application No. PCT/EP2018/061017, dated Jul. 16, 2018, 10 pp.

*Primary Examiner* — Michelle Mandala
*Assistant Examiner* — Jordan M Klein
(74) *Attorney, Agent, or Firm* — Slater Matsil, LLP (57) ABSTRACT

A power semiconductor module includes a substrate with a metallization layer; at least one power semiconductor chip bonded to the substrate; and a mold encapsulation partially encapsulating the semiconductor chip and the substrate; the mold encapsulation includes at least one window exposing a terminal area of the metallization layer; and a border part of the mold encapsulation between the window and a border of the substrate has a height over the substrate smaller than a maximal height of a central part of the mold encapsulation.

20 Claims, 4 Drawing Sheets

(52) U.S. Cl.
CPC .... *H01L 23/3675* (2013.01); *H01L 23/49861* (2013.01); *H01L 24/48* (2013.01); *H01L 25/162* (2013.01); *H01L 2224/48091* (2013.01); *H01L 2224/48106* (2013.01); *H01L 2224/48227* (2013.01); *H01L 2924/19107* (2013.01); *H01L 2924/30107* (2013.01)

(56) References Cited

U.S. PATENT DOCUMENTS

| | | | |
|---|---|---|---|
| 2013/0010442 A1 | 1/2013 | Heim et al. | |
| 2015/0103498 A1* | 4/2015 | Lee | H01L 23/49811 361/737 |
| 2015/0145123 A1* | 5/2015 | Ha | H01L 23/49811 257/737 |
| 2017/0263527 A1* | 9/2017 | Mohn | H01L 23/3675 |
| 2018/0218957 A1 | 8/2018 | Osterwald et al. | |

FOREIGN PATENT DOCUMENTS

| | | | | |
|---|---|---|---|---|
| DE | 102008001413 A1 * | 10/2009 | | H01L 24/48 |
| DE | 102008001413 A1 | 10/2009 | | |
| DE | 102008045615 A1 * | 3/2010 | | H01R 13/2435 |
| DE | 102008045615 A1 | 3/2010 | | |
| DE | 102010001545 A1 | 8/2011 | | |
| DE | 102011007227 A1 | 10/2011 | | |
| DE | 102014219998 A1 | 4/2016 | | |
| DE | 102015112451 A1 * | 2/2017 | | H01L 23/49544 |
| DE | 102015112451 A1 | 2/2017 | | |
| EP | 2548423 B1 | 1/2016 | | |
| EP | 3089209 A1 | 11/2016 | | |

\* cited by examiner

RESIN ENCAPSULATED POWER SEMICONDUCTOR MODULE WITH EXPOSED TERMINAL AREAS

FIELD OF THE INVENTION

The invention relates to a power semiconductor module, a power semiconductor module assembly and a method for manufacturing a power semiconductor module.

BACKGROUND OF THE INVENTION

Power semiconductor modules containing solid-state semiconductor switches, such as IGBTs or MOSFETs, are used in various power electronics applications to switch or rectify electric currents. An important and fast growing application are converter systems for electric or hybrid electric vehicles. A typical module for such applications may have a voltage rating of up to 1200 V and a current rating of several hundred amperes.

Usually, a power semiconductor module requires multiple electrical terminals, by which the DC and AC load currents are connected to an external busbar. Auxiliary signal terminals, such as for controlling the gates of the semiconductor chips in the module, are connected to an external gate driver circuit board.

The power terminals are preferably made of Cu and may need to provide enough cross-section to carry currents on the order of several hundreds of Amperes. Common solutions for power terminals include screw connection to an external busbar or leadframe terminals which are welded to an external busbar. For the load connections of lower-power modules, as well as the auxiliary connections, pins soldered into through-holes of a circuit board, press-fit pins, or spring connections may be used.

All these solutions have in common, that metallic connectors are sticking out of the power semiconductor module. This may result in several limitations for a transfer-molded power semiconductor module with leadframe terminals.

Usually, the leadframe terminals can only be in one plane, which is the sealing plane of the two parts of the mold and only may be attached to the periphery of a substrate of the power semiconductor module. This may limit the freedom regarding the terminal and substrate design, and may also prohibit a further size reduction of the module, in case many terminals are needed.

Furthermore, using multiple leadframes of different thicknesses and/or materials may be challenging regarding a sealing of the mold. However, different leadframes may be needed for power and auxiliary connections in order to achieve a sufficient cross-section of the power terminals and press-fit connections for the auxiliary terminals.

Terminals sticking out at the side of a power semiconductor module may impose limitations on an attachment of the module to a cooler: Access to the interface between baseplate and cooler may be needed from the top, which may be obstructed by the leadframe terminals.

Additionally, two bonding processes are usually required for the terminals: Firstly, bonding of the terminals to the substrate and, secondly, bonding of the terminals to an external busbar.

US 2015/0145123 A1 shows a power semiconductor module with pins mounted to a substrate that is covered by a molding part with pin insertion openings.

US 2015/0103498 A1 shows a power module package with an electrode attached to a module, which is arranged in an opening in an encapsulation member.

DE 10 2015 112 451 A1 shows a power module, which has a housing with openings that provide access to an electrode of a semiconductor chip on a substrate and to a metallization layer on the substrate.

DE 10 2008 001 413 A1 shows a power module, which has a housing made of mold material. The thickness of the mold material over a substrate with a semiconductor chip is adapted to the height of electrically conducting parts of the power module on the substrate.

DE 10 2008 045 615 A1 shows a power module with windows in a molded housing. A conducting plate is attached to the top of the housing and terminals in the windows interconnect a metallization layer of the power module with the conducting plate.

EP 3 089 209 A1 shows a power module with a cooling body provided in a cavity.

DESCRIPTION OF THE INVENTION

It is an objective of the invention to provide an easy to manufacture and easy to assembly power semiconductor module and/or to provide a power semiconductor module with electrical connections having a low stray inductance.

These objectives are achieved by the subject-matter of the independent claims. Further exemplary embodiments are evident from the dependent claims and the following description.

A first aspect of the invention relates to a power semiconductor module. A semiconductor module may be any device composed of one or more semiconductor chips, their electrical and mechanical interconnections and a housing for these components. The term "power" here and in the following may refer to modules and/or semiconductor chips adapted for processing current of more than 100 V and/or more than 10 A. For example, the power semiconductor module may be used in automotive applications, such as electric vehicles, hybrid vehicles, motorbikes, busses, trucks, off-road construction vehicles and charging stations.

According to an embodiment of the invention, the power semiconductor module comprises a substrate with a metallization layer, at least one power semiconductor chip bonded to the substrate, and a mold encapsulation partially encapsulating the semiconductor chip and the substrate. The substrate may be a plate of an electrical insulating material, such as plastics or ceramics, which is covered with a metallization layer on one side. It may be possible that the substrate has a further metallization layer on the other side. It also may be that the substrate is solely provided by one or more metallization layers. For example, the substrate may be or may comprise a leadframe. The metallization layer may be structured to provide electrical conductors to which the semiconductor chip is connected.

The power semiconductor chip may be based on Si or SiC and/or may provide one or more semiconductor elements, such as diodes and/or semiconductor switches. Such a switch may be a transistor, thyristor, IGBT and/or MOSFET. It may be that the power semiconductor module comprises a semiconductor chip with a switch and a semiconductor chip with a diode connected anti-parallel to the switch via conductors of the metallization layer. Furthermore, the power semiconductor module may comprise one or more half-bridges composed of such combinations of switch and diode.

The one or more power semiconductor chips are bonded to the metallization layer. Bonding may refer to soldering, sintering, and welding. Furthermore, the one or more power semiconductor chips may be connected with each other and with the metallization layer via bond wires.

The mold encapsulation may be generated by transfer molding, for example with a thermoplastic material or with a chemical curing material. The molding material may be an epoxy resin. The mold encapsulation may completely enclose the one or more power semiconductor chips and the parts of the electrical conductors directly attached to the one or more power semiconductor chips. Furthermore, the substrate and the metallization layer may be partially covered by the mold encapsulation.

According to an embodiment of the invention, the mold encapsulation comprises at least one window exposing a terminal area of the metallization layer. In other words, the mold encapsulation may provide an opening or window for directly accessing a part of the metallization layer that may be used as terminal area, i.e. for interconnecting external conductors. The one or more terminal areas may be the only parts of the metallization layer that are exposed to the outside of the power semiconductor module. A terminal area may be a flat conductor exposed to an outside of the mold encapsulation.

Due to the terminal areas, the power semiconductor module may be electrically connected to other devices with one one-piece conductor. Terminals may be saved and an additional attachment process for connecting the terminals to a further conductor, like a busbar, may be saved. The power semiconductor module may be a transfer-molded power semiconductor module that has openings or windows in mold encapsulation that directly expose parts of the substrate carrying the power semiconductor chips.

Additionally, a border part of the mold encapsulation between the window and a border of the substrate has a height over the substrate smaller than a maximal height of a central part of the mold encapsulation. It has to be noted that the height and the maximal height may be determined in a direction orthogonal to a plane defined by the metallization layer. Furthermore, the height and/or the maximal height may be defined with respect to the substrate and/or an upper side of the substrate. It may be that the border of the substrate is embedded in the border part of the mold encapsulation. In this case, only the border part above the substrate contributes to the height over the substrate.

The central part of the mold encapsulation, which encapsulates the power semiconductor chip and its electrical connections, may be higher as the border part. Vice versa, the border part may be lower as the central part. In such a way, it is possible that a conductor, such as a conductor strip, conducting ribbon or bond wire may be attached to the terminal area and may be guided away from the terminal area at a level lower than the upper side of the central part. This may result in more compact electrical connections of the power module.

It has to be noted that terms like "higher", "lower", "upper", "top", "bottom" are not defined with respect to an orientation of the power semiconductor module in space, but may be defined relative to a plane defined by the substrate.

The power semiconductor module further comprises a power terminal bonded with an end to the terminal area in the window in the mold encapsulation. A terminal part of the power terminal, such as a second end of the power terminal, protrudes above the border part in a direction parallel to the substrate, such that a vertical height over substrate of the terminal part is smaller than the maximal height of the central part of the mold encapsulation. The power semiconductor module may have electrical interconnections that protrude from the module at a level lower than the upper side of the central part of the mold encapsulation. For example, the power terminal may be a folded metal strip with two parallel ends.

In summary, the power semiconductor module may provide the following advantages.

The power semiconductor module may have an improved electrical performance, due to more freedom regarding substrate and terminal design. Terminal positions are not restricted by requirements imposed by a leadframe in combination with a transfer molding approach. For example, a shorter connection to a DC link capacitor may be provided, since no space for a busbar to terminal welding is needed. A shorter connection may lead to a lower commutation loop inductance. Additionally, shorter auxiliary connections may lead to a reduced gate inductance.

A manufacturing and mounting of the power semiconductor module may result in reduced costs, since terminals and terminal attachment processes are not needed anymore. For example, there may be an improved flexibility regarding terminal connections. In different applications, different connection technologies may be used. A direct welding of busbars to the terminal areas at least does not require more effort than a welding of busbars to terminals.

The power semiconductor module may have an improved manufacturability. The one or more power semiconductor chips may be protected from particle contamination during an ultrasonic welding process of a conductor to a terminal area, which may be performed after the molding. Also, the molding process may be simplified and risks due to difficult sealing of multiple leadframes with different thicknesses are avoided.

According to an embodiment of the invention, the height over the substrate of the border part is smaller than a maximal height of conductors over the substrate, wherein the conductors are encapsulated in the mold encapsulation and are bonded to the semiconductor chip and the metallization layer. In others words, a terminal or conductor attached to the terminal area may leave the power semiconductor module on a level below the maximal heights of the electrical conductors inside the mold encapsulation.

According to an embodiment of the invention, the border part is a border of the mold encapsulation at least partially enclosing the central part of the mold encapsulation. For example, the border part may be a strip of the mold encapsulation besides the central part, which is thinner than the central part. The border part may run along a side of the central part.

According to an embodiment of the invention, the border part has a height over the substrate smaller than the maximal height of the central part around and/or on all sides of the window. In other words, the window may be provided in a part of the mold encapsulation with a smaller height than the central part. It also may be possible that the border part has a smaller height towards the central part.

According to an embodiment of the invention, the border part overlaps the border of the substrate. For example, the mold encapsulation may be provided on both sides of the substrate and may enclose the complete substrate, except the one or more terminal areas.

It also may be possible that a cooling body is attached to a backside of the substrate, i.e. the side of the substrate opposite to the side to which the one or more power semiconductor chips are bonded. In this case, the border part may overlap the border of the substrate and may be in contact with the cooling body. In this case, only one side of the power semiconductor module may be provided with the mold encapsulation.

According to an embodiment of the invention, the mold encapsulation comprises at least two windows, each window exposing a terminal area of the metallization layer. It may be that some or all of the terminals of the power semiconductor module are provided by terminal areas.

It also may be that some terminals of the power semiconductor modules are provided by leadframe terminals, which may be partially enclosed by the mold encapsulation.

According to an embodiment of the invention, at least one of the terminal areas is a power terminal area, i.e. may be electrically connected to a load electrode or power electrode of the power semiconductor chip, such as a collector or an emitter.

According to an embodiment of the invention, at least one of the terminal areas is an auxiliary terminal area. The area of an auxiliary terminal area may be smaller than an area of a power terminal area. For example, an auxiliary terminal area may be electrically connected to a gate electrode of the power electronic chip.

In general, a conventional leadframe approach in combination with the exposed terminal areas may be used. A leadframe may be used for the auxiliary connections and/or auxiliary terminals. The terminal areas may be power terminal areas and/or may be used for a direct busbar attachment.

According to an embodiment of the invention, a border part with a height over the substrate smaller than a maximal height of the central part provides at least two windows. When the power semiconductor module has more than one terminal area, these terminal areas may be provided in a part of the mold encapsulation, which has a smaller height over the substrate than the central part. For example, two or more terminal areas may be provided on a side of the central part along a border of the substrate.

It has to be noted that the border part and/or the central part may have a uniform height and/or thickness. The terminal areas may be provided in a border part with a uniform height.

According to an embodiment of the invention, the power semiconductor module further comprises two power terminals with two coplanar conductor strips, wherein each power terminal comprises at least two feet protruding from the respective conductor strip, such that a foot from the one power terminal alternates with a foot from the other one power terminal and wherein the feet from the power terminals are bonded to a row of terminal areas, each of which is provided by a dedicated window in the mold encapsulation.

With the power module, a low-inductance coplanar busbar connection to the electrical device such as a capacitor is enabled. Due to the coplanar and/or parallel arranged conductor strips, the electrical interconnection may have a low inductance. The terminal areas may be arranged and interconnected with the one or more power semiconductor chips in such a way that alternating terminal areas are connected to the same potential. The coplanar conductor strips may be connected to such a row of terminal areas. This may be done with bended parts of the conductor strips, which are bended down to the respective terminal area, i.e. with feet.

For example, capacitor leads may be directly bonded to the terminal areas to form a low-inductive connection, which, for example, may be arranged in an alternating +/− pattern.

According to an embodiment of the invention, the power semiconductor module further comprises an auxiliary terminal bonded with a first end to a terminal area in a window in the mold encapsulation and with a second end protruding above the central part. For example, the auxiliary terminal may be a pin, which optionally may have a press-fit connection on its upper, second end, i.e. the end opposite of the end with which it is bonded to the terminal area. The second end may be higher than the central part, such that a circuit board may be attached to the central part and stuck to the second end.

In general, a connection to an external circuit may be achieved by bonding a pin structure to one or more terminal areas. Such a structure may comprise press-fit and/or solder pins, which may be bonded, for example by welding or soldering, to the terminal area and later connected to a circuit board, such as a gate driver circuit board.

According to an embodiment of the invention, the power semiconductor module further comprises a circuit board attached to the central part of the mold encapsulation. The circuit board, such as a gate driver circuit board, may be a printed circuit board or may be based on another type of substrate, such as a ceramics substrate. For example, the circuit board may be glued and/or screwed to the mold encapsulation.

According to an embodiment of the invention, the power semiconductor module further comprises a bond wire bonded to a terminal area in a window and bonded to the circuit board. A connection to the circuit board may be achieved by a wire bonding process between the terminal area and a pad on the circuit board.

According to an embodiment of the invention, the power semiconductor module further comprises an electrically conducting spring element connected to the printed circuit board and pressed against a terminal area in a window. It is also possible that a pin and/or a spring element integrated in the circuit board may be used to form a connection to a terminal area. The spring element may solely be pressed on the terminal area and may be optionally attached to the terminal area, for example by a bonding process.

According to an embodiment of the invention, an end of a terminal bonded to a terminal area in a window in the mold encapsulation is embedded in a molding material filled into the window. To enhance the reliability of the connection of the power and/or auxiliary terminals to the terminal areas, a potting of the bond end or bond foot, for example with epoxy resin, may be possible. The casting material may be different from the molding material of the mold encapsulation. Such a potting may improve vibration and corrosion resistance of electronic assemblies. A dam or insulation structure formed by the casting material may be used to provide the required creepage distances between exposed areas of different electrical potential.

According to an embodiment of the invention, the power semiconductor module further comprises a cooling plate attached to the substrate opposite to the metallization layer and the power semiconductor chip. The cooling plate may be attached to the substrate, for example to an opposite metallization layer. According to an embodiment of the invention, the mold encapsulation is provided solely on one side of the cooling plate.

According to an embodiment of the invention, the border part of the mold encapsulation extends over the border of the substrate and is deposited on the cooling plate. The cooling plate may have a larger vertical extension as the substrate and/or the mold encapsulation may protrude over the border of the substrate contacting the cooling plate. However, the border of the cooling plate need not be encapsulated into the mold encapsulation.

According to an embodiment of the invention, the power semiconductor module further comprises a cooling body with a cooling cavity, which is closed by the cooling plate inserted into the cooling body, wherein the cooling plate is welded to the cooling plate along a border of the cooling plate. The cavity may be flooded with a cooling liquid that is pumped through the cooling cavity.

Since the terminals and/or electrical connections, which protrude over the border of the power semiconductor module, may be attached to the module after the molding, the borders of the cooling plate are more easily accessible and may be attached to the cooling body by welding, for example by friction stir welding.

A further aspect of the invention relates to a power semiconductor module assembly. Such an assembly may be a device comprising one or more power semiconductor modules as described in the above and in the following and a further power electrical device, such as a capacitor and/or other power semiconductor modules. For example, the power semiconductor module assembly may be or may be the part of an electrical converter.

According to an embodiment of the invention, the power semiconductor module assembly further comprises a conductor strip, such as the power terminal, directly interconnecting the power electrical device with the power semiconductor module, wherein the conductor strip is bonded to a terminal area in a window and to the power electrical device. The conductor strip may be a part of a busbar, for example a coplanar busbar as described herein. The conductor strip may be a folded metal strip and/or may be a one-piece strip. In such a way, additional connections between the power semiconductor module and the power electrical device may be avoided.

The connection to an external power electrical device may be achieved by bonding a coplanar busbar to terminal areas, for example using a welding process. A DC link capacitor may be directly connected to the substrate of the power semiconductor module.

A further aspect of the invention relates to a method of manufacturing a power semiconductor module, for example as described in the above and in the following. It has to be understood that features of the method as described in the above and in the following may be features of the power semiconductor module as well as the power semiconductor module assembly as described in the above and in the following.

According to an embodiment of the invention, the method comprises: providing a substrate with a metallization layer with at least one power semiconductor chip bonded to the substrate; and molding the semiconductor chip and the substrate into a mold encapsulation, wherein the mold encapsulation comprises a central part, which encapsulates the semiconductor chip, and the mold encapsulation comprises at least one window exposing a terminal area of the metallization layer and wherein a border part of the mold encapsulation between the window and a border of the substrate has a height over the substrate smaller than a maximal height of the central part of the mold encapsulation.

The molding may be transfer molding, for example with an epoxy resin as molding material. To produce the windows that expose the terminal areas on the substrate, it is possible to implement spring structures in a mold tool that may keep the desired terminal areas free of molding material. Transfer molding and post curing under inert atmosphere, such as nitrogen, may be beneficial to avoid oxidation of the termination areas.

Depending on the process for connecting a terminal and/or a conductor to the terminal area, a selective or complete plating of the metallization layer of the terminal area may be performed prior to or after the molding.

According to an embodiment of the invention, the method further comprises: bonding a power terminal with an end to the terminal area, wherein a part of the power terminal protrudes above the border part in a direction parallel to the substrate, such that a vertical height over the substrate of the part is smaller than the maximal height of the central part of the mold encapsulation.

According to an embodiment of the invention, the method further comprises: welding a cooling plate attached to the substrate to a cooling body. Before forming the connections from the one or more terminal areas to an external electronic device and/or bonding terminals, the border of the cooling plate may be welded to the cooling body, for example with friction stir welding.

The auxiliary and/or power connections, which may obstruct the welding process, may be attached later. This may have several advantages, such as more freedom in the design of the terminals and/or conductors bonded to the terminal areas, the substrate layout and the mold encapsulation. Also, a risk of chip contamination during ultrasonic welding may be avoided. Less process steps may be needed, and an integration of the cooling body may be simplified.

According to an embodiment of the invention, the method further comprises: bonding at least one of an auxiliary terminal and a power terminal to a terminal area provided in a window of the encapsulation. This bonding may be performed after molding and/or before or after a welding of a cooling plate to a cooling body.

According to an embodiment of the invention, the method further comprises: bonding a conductor strip to a terminal area provided in a window of the encapsulation and to a power electrical device. It also may be possible, that the bonding of conductors to one or more terminal areas is performed after the mechanical connection of the power semiconductor module to further electrical devices.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
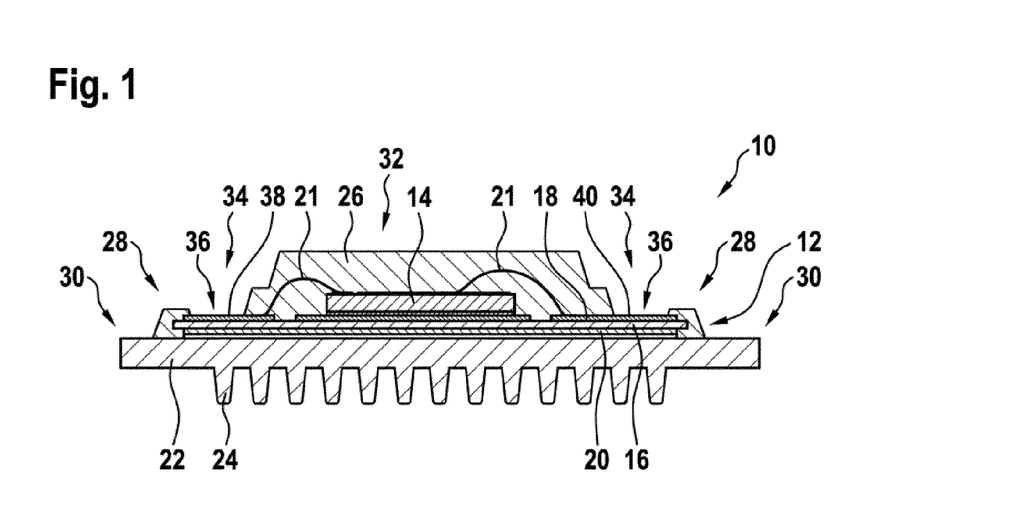
FIG. 1 schematically shows a cross-section through a power semiconductor module according to an embodiment of the invention.

FIG. 1 shows a power semiconductor module 10, which comprises a substrate 12 onto which a power semiconductor chip 14 is bonded. It has to be noted that more than one power semiconductor chip 14 may be bonded to the substrate, for example as described above. However, only one power semiconductor chip 14 is shown in FIG. 1.

The substrate 12 is a ceramics substrate with an insulating inner ceramics layer 16 and two outer metallization layers 18, 20. The upper metallization layer 18 is structured to provide several conductors. On one of these conductors, the power semiconductor chip 14 is bonded with a planar power electrode. Furthermore, bond wires 21 interconnect the other side of the power semiconductor chip 14, which, for example, provide a further planar power electrode and a planar gate electrode.

It may be possible that the substrate 12 is a printed circuit board or a leadframe, i.e. may be composed solely of one or more metallization layers.

A cooling plate 22 is bonded to the substrate 12 and the metallization layer 20. As shown, the cooling plate 22 may have fins or ribs 24 below the substrate 12.

The substrate and the semiconductor chip 14 are embedded into a mold encapsulation 26. After the bonding of the power semiconductor chip 14, the substrate 12 may have been put into a mold tool and the mold encapsulation 26 may have been generated by transfer molding, for example with an epoxy resin.

The cooling plate 22 has a vertical extension larger than the substrate 12 (which is an extension in a direction parallel to the metallization layer 18 of the substrate). The mold encapsulation 26 may only be provided on one side of the power semiconductor module 10 and may extend in a vertical direction over the border 28 of the substrate 12 but not over the border 30 of the cooling plate 22.

The mold encapsulation 26 has a central part 32, in which the power semiconductor chip 14 and the bond wires is enclosed and a border part 34, in which windows 36 are provided, which expose terminal areas 38, 40 on the metallization layer 18. The terminal areas 38, 40 are exposed parts of the metallization layer 18, which may be used for electrically contacting the module 10 and/or may be seen as planar terminals of the module 10.

Figure 7:
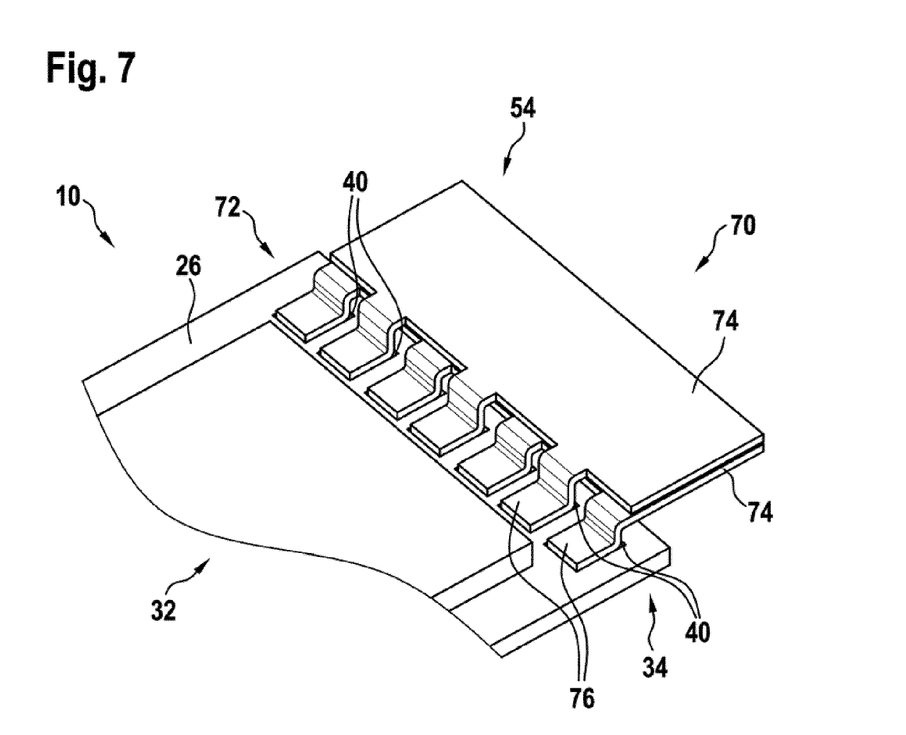
FIG. 7 schematically shows a perspective view of a part of a power semiconductor module according to a further embodiment of the invention.

It has to be noted that the mold encapsulation 26 may be one piece and/or that the one or more border parts 34 of the mold encapsulation 26 may be interconnected with the central part 32 as shown in FIG. 7.

The border part 34 of the mold encapsulation 26 has a smaller maximum height over the substrate 12 (i.e. maximum distance, to which the border part 34 extends above the substrate 12) than the central part 32. The central part 32 may be provided only on one side of the substrate 12 and/or the maximal height of the central part 32 over the substrate 12 may be the maximal thickness of the central part 32. A border of the substrate 12 may be embedded in the border part 34 of the mold encapsulation 26. Only the thickness of the border part 34 on the side of the substrate 12, onto which also the central part 32 is provided, may contribute to the height of the border part 34 over the substrate 12.

It may be that the border part 34 is only a part of the mold encapsulation between a window 36 and the border 28 of the substrate. It also may be that the border part surrounds a window 36 at least partially. As shown in FIG. 1 and also FIG. 7, the border part 34 may surround a window 36 completely. As shown in FIG. 7, more than one window 36 may be provided by a border part 34. Each or at least some of the windows 36 may be openings in the mold encapsulation that are completely surrounded by the mold encapsulation 26.

Figure 2:
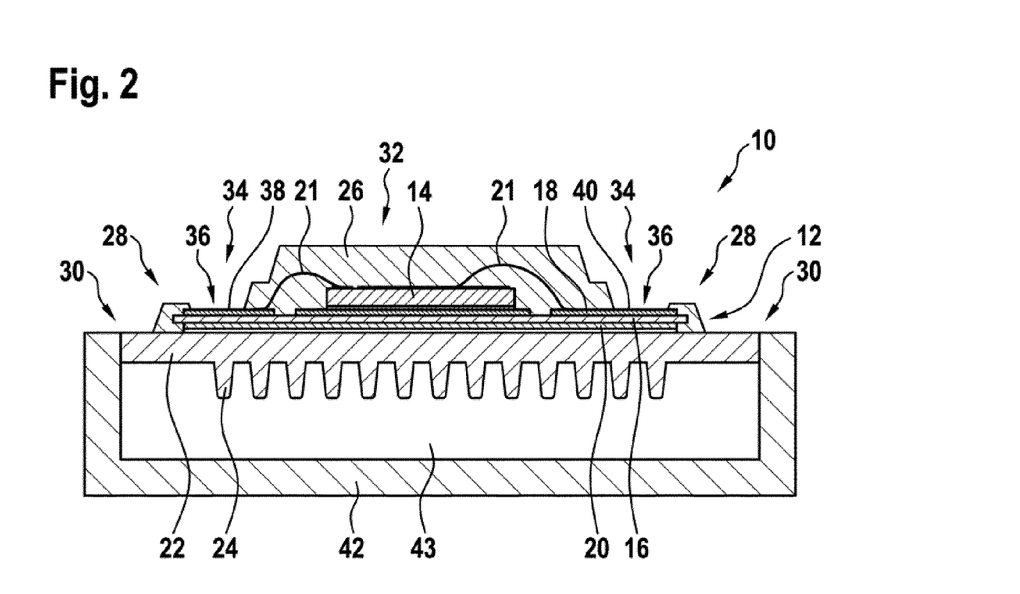
FIG. 2 schematically shows a cross-section through a power semiconductor module according to a further embodiment of the invention.

FIG. 2 shows the power semiconductor module after a further manufacturing step. The cooling plate 22 has been attached to a cooling body 42, which has a cooling cavity 43, which during operation of the module 10 may be filled with a cooling liquid. The cooling plate 22 may have been welded to the cooling body 42 by welding. Since no obstructing terminals are present, which may protrude from the module 10, the border 30 of the cooling plate is accessible even after the molding of the mold encapsulation 26.

Figure 3:
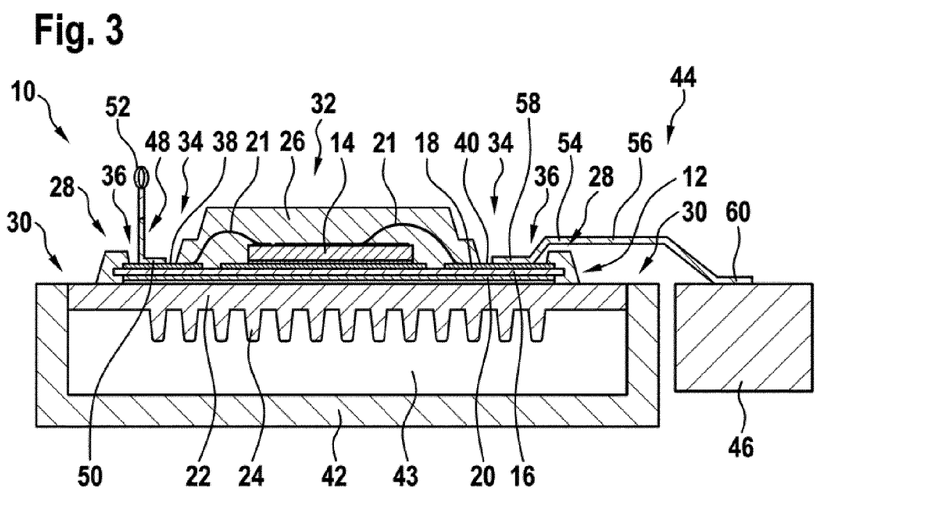
FIG. 3 schematically shows a cross-section through a power semiconductor module assembly according to an embodiment of the invention.

FIG. 3 shows a power semiconductor module assembly 44 comprising the power semiconductor module 10 and a further electrical device 46. The assembly 44 may be a converter and/or the electrical device 46 may be a further power semiconductor module and/or a DC link capacitor.

A connection of terminals and/or conductors to the terminal areas 38, 40 is done after the molding process and possibly even after a mounting of the power semiconductor module 10 to the assembly 44.

Before or after the mounting of the power semiconductor module 10, terminal 48 may be attached to one or more of the terminal areas 38. For example, the terminal 48 may be an auxiliary terminal 48, the terminal area 38 may be an auxiliary terminal area 38, which may be electrically connected to a gate electrode of the power semiconductor chip 14.

The terminal 48 may be a pin with a bent foot or end 50 that may be welded to the terminal area 38, for example by ultrasonic welding. An upper, second end 52 of the terminal 48, which may be a press-fit connection, may protrude over the central part 32 of the mold encapsulation 26. In such a way, a circuit board may be pressed on the terminal 38 and attached to the central part 32.

Furthermore, a folded conducting strip 54 may directly interconnect the terminal area 40 with the electric device 46. The folded strip 54 may be made of copper or another conducting metal material and/or may be bent, such that a middle part 56 is on a higher level than a foot or end 58, which is bonded to the terminal area 40. Due to the border part 34, which is lower than the central part 32 of the mold encapsulation, even the middle part 56 of the folded strip may be lower than the upper side of the central part 32.

The conducting strip 54 may be welded with its end 58 to the terminal area 40 and/or with its other end 60 to the power electrical device 46. For example, the leads of a DC link capacitor and/or a busbar leading to an electric motor may be directly bonded to the terminal area 40.

It has to be noted that the conducting strip 54 may be seen as terminal and/or that a separate terminal may be bonded to the terminal area 40 accordingly as the conducting strip 54.

Figure 4:
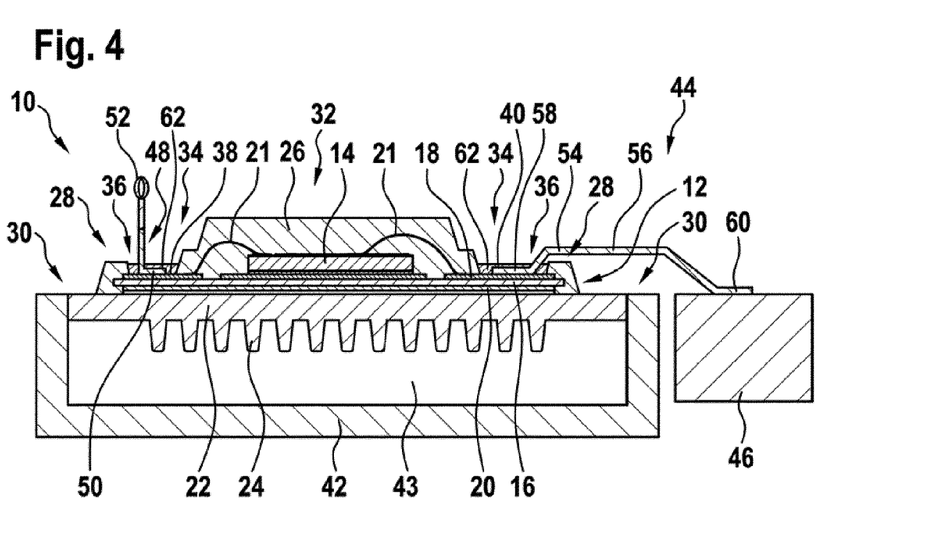
FIG. 4 schematically shows a cross-section through a power semiconductor module assembly according to a further embodiment of the invention.

As shown in FIG. 4, one or more of the windows 36 may be filled with a casting material 62, which may be different from the molding material of the mold encapsulation 34. The casting material 62 may cover completely the terminal area 38, 40 of the respective window and/or the foot 50, 52 of the terminal 48 or conductor 54 bonded to the terminal area 38, 40.

Figure 5:
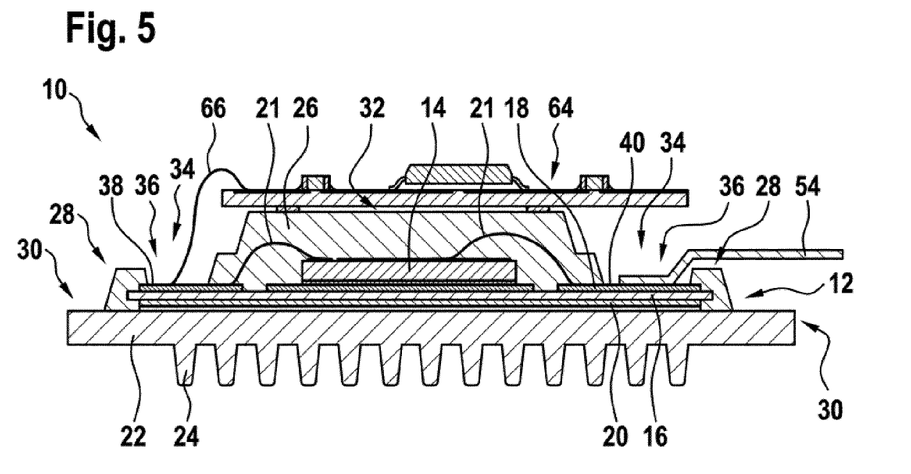
FIG. 5 schematically shows a cross-section through a power semiconductor module according to a further embodiment of the invention.
Figure 6:
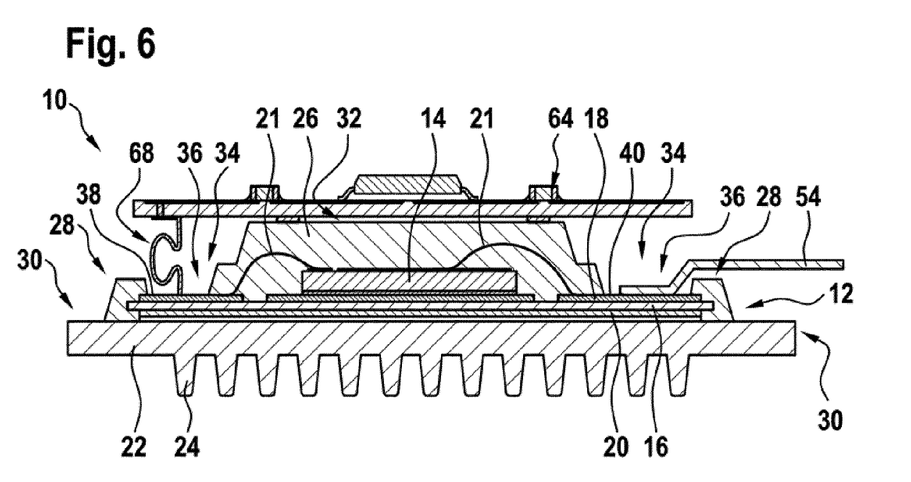
FIG. 6 schematically shows a cross-section through a power semiconductor module according to a further embodiment of the invention.

FIGS. 5 and 6 show that a circuit board 64 may be attached to the central part 32 of the mold encapsulation 26. The circuit board 64 may be a printed circuit board and/or may carry electronic circuitry, such as a gate driver.

In FIG. 5, the circuit board 64 is interconnected to a terminal area 38 via a bond wire 66 that is bonded to the terminal area 38 with one end and to the circuit board 64 with the other end. The bond wire 66 and/or the circuit board 64 may be attached to the module 10 before the mounting of the module 10 to the assembly 44 or after.

FIG. 6 shows that the circuit board 64 may comprise a spring element 68 that is pressed against the terminal area 38, when the circuit board 64 is mounted to the module 10. Again this mounting may be performed before the mounting of the module 10 to the assembly 44 or after.

FIG. 7 shows, that a coplanar terminal arrangement 70 may be connected to a row 72 of terminal areas 40. The terminal areas 40 may be connected to the semiconductor chip(s) 14, in such a way that every second terminal area 40 is connected to the same potential.

The coplanar terminal arrangement 70 comprises two power terminals 54 with two coplanar conductor strips 74, which comprise feet 76 protruding from the respective conductor strip 74, such that a foot 76 from the one power terminal 54 alternates with a foot 76 from the other one power terminal 54. Such an arrangement may result in a very low stray inductance.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practicing the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 power semiconductor module
12 substrate
14 semiconductor chip
16 ceramics layer
18 upper metallization layer
20 bottom metallization layer
21 bond wire
22 cooling plate
24 fins or ribs
26 mold encapsulation
28 border of substrate
30 border of cooling plate
32 central part
34 border part
36 window
38 auxiliary terminal area
40 power terminal area
42 cooling body
43 cooling cavity
44 power semiconductor module assembly
46 power electrical device
48 auxiliary terminal
50 first end
52 second end
54 conducting strip, power terminal
56 middle part
58 first end
60 second end
62 casting material
64 circuit board
66 bond wire
68 spring element
70 coplanar terminal arrangement
72 row of terminal areas
74 conductor strips
76 foot

The invention claimed is:

1. A power semiconductor module, comprising:
a substrate with a metallization layer;
at least one power semiconductor chip bonded to the substrate;
a mold encapsulation partially encapsulating the semiconductor chip and the substrate, wherein the mold encapsulation comprises at least one window exposing a terminal area of the metallization layer;
a power terminal bonded with an end to the terminal area;
wherein the mold encapsulation comprises a central part, which encapsulates the semiconductor chip;
wherein a border part of the mold encapsulation between the window and a border of the substrate has a height over the substrate smaller than a maximal height over the substrate of the central part of the mold encapsulation;
wherein a part of the power terminal protrudes above the border part in a direction parallel to the substrate, such that a vertical height over the substrate of the part is smaller than the maximal height of the central part of the mold encapsulation.

2. The power semiconductor module of claim 1,
wherein the height over the substrate of the border part is smaller than a maximal height of conductors over the substrate, wherein the conductors are encapsulated in the mold encapsulation and are bonded to the semiconductor chip and the metallization layer.

3. The power semiconductor module of claim 2, wherein the border part overlaps the border of the substrate.

4. The power semiconductor module of claim 3, wherein the mold encapsulation comprises at least two windows, each window exposing a terminal area of the metallization layer;
wherein at least one of the terminal areas is a power terminal area;
wherein at least one of the terminal areas is an auxiliary terminal area.

5. The power semiconductor module of claim 2, wherein the mold encapsulation comprises at least two windows, each window exposing a terminal area of the metallization layer;
wherein at least one of the terminal areas is a power terminal area;
wherein at least one of the terminal areas is an auxiliary terminal area.

6. The power semiconductor module of claim 2, further comprising:
two power terminals with two coplanar conductor strips;
wherein each power terminal comprises at least two feet protruding from the respective conductor strip, such that a foot from the one power terminal alternates with a foot from the other one power terminal;

wherein the feet from the power terminals are bonded to a row of terminal areas, each of which is provided by a dedicated window in the mold encapsulation.

7. The power semiconductor module of claim 1, wherein the border part overlaps the border of the substrate.

8. The power semiconductor module of claim 7, wherein the mold encapsulation comprises at least two windows, each window exposing a terminal area of the metallization layer;
wherein at least one of the terminal areas is a power terminal area;
wherein at least one of the terminal areas is an auxiliary terminal area.

9. The power semiconductor module of claim 7, wherein the border part provides at least two windows.

10. The power semiconductor module of claim 1, wherein the mold encapsulation comprises at least two windows, each window exposing a terminal area of the metallization layer;
wherein at least one of the terminal areas is a power terminal area;
wherein at least one of the terminal areas is an auxiliary terminal area.

11. The power semiconductor module of claim 1, wherein the border part provides at least two windows.

12. The power semiconductor module of claim 1, further comprising:
two power terminals with two coplanar conductor strips;
wherein each power terminal comprises at least two feet protruding from the respective conductor strip, such that a foot from the one power terminal alternates with a foot from the other one power terminal;
wherein the feet from the power terminals are bonded to a row of terminal areas, each of which is provided by a dedicated window in the mold encapsulation.

13. The power semiconductor module of claim 1, further comprising:
an auxiliary terminal bonded with a first end to a terminal area in a window in the mold encapsulation and with a second end protruding above the central part.

14. The power semiconductor module of claim 1, further comprising:
a circuit board attached to the central part of the mold encapsulation;
at least one of a bond wire bonded to a terminal area in a window and bonded to the circuit board and an electrically conducting spring element connected to the printed circuit board and pressed against a terminal area in a window.

15. The power semiconductor module of claim 1, wherein an end of a terminal bonded to a terminal area in a window in the mold encapsulation is embedded in a casting material filled into the window.

16. The power semiconductor module of claim 1, further comprising:
a cooling plate attached to the substrate opposite to the power semiconductor chip;
wherein the mold encapsulation is provided solely on one side of the cooling plate;
wherein the border part of the mold encapsulation extends over the border of the substrate and is deposited on the cooling plate.

17. The power semiconductor module of claim 16, further comprising:
a cooling body with a cooling cavity, which is closed by the cooling plate inserted into the cooling body;
wherein the cooling plate is welded to the cooling body along a border of the cooling plate.

18. A power semiconductor module assembly, comprising:
a power semiconductor module according to claim 1;
a power electrical device;
wherein the power terminal directly interconnects the power electrical device with the power semiconductor module.

19. A method of manufacturing a power semiconductor module, the method comprising:
providing a substrate with a metallization layer, with at least one power semiconductor chip bonded to the substrate;
molding the semiconductor chip and the substrate into a mold encapsulation, wherein the mold encapsulation comprises a central part, which encapsulates the semiconductor chip, and the mold encapsulation comprises at least one window exposing a terminal area of the metallization layer and wherein a border part of the encapsulation between the window and a border of the substrate has a height over the substrate smaller than a maximal height of the central part of the mold encapsulation;
bonding a power terminal with an end to the terminal area;
wherein a part of the power terminal protrudes above the border part in a direction parallel to the substrate, such that a vertical height over the substrate of the part is smaller than the maximal height of the central part of the mold encapsulation.

20. The method of claim 19, further comprising:
welding a cooling plate attached to the substrate to a cooling body;
bonding an auxiliary terminal to a terminal area provided in a window of the mold encapsulation;
bonding a conductor strip to a terminal area provided in a window and to a power electrical device.

* * * * *

UNITED STATES PATENT AND TRADEMARK OFFICE
CERTIFICATE OF CORRECTION

PATENT NO. : 10,950,516 B2
APPLICATION NO. : 16/673201
DATED : March 16, 2021
INVENTOR(S) : Fabian Mohn Page 1 of 1

It is certified that error appears in the above-identified patent and that said Letters Patent is hereby corrected as shown below:

In the Claims

In Column 14, Line 51, Claim 20, delete "a window and" and insert --a window of the mold encapsulation and--.

Signed and Sealed this
Sixth Day of July, 2021

Drew Hirshfeld
*Performing the Functions and Duties of the*
*Under Secretary of Commerce for Intellectual Property and*
*Director of the United States Patent and Trademark Office*